(12) United States Patent
Kim

(10) Patent No.: US 6,667,204 B2
(45) Date of Patent: Dec. 23, 2003

(54) SEMICONDUCTOR DEVICE AND METHOD OF FORMING THE SAME

(75) Inventor: Nam Sik Kim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/155,016

(22) Filed: May 28, 2002

(65) Prior Publication Data

US 2003/0107082 A1 Jun. 12, 2003

(30) Foreign Application Priority Data

Dec. 10, 2001 (KR) .................................. 2001-77847

(51) Int. Cl.[7] .......................................... H01L 21/762
(52) U.S. Cl. ..................................... 438/221; 438/430
(58) Field of Search ............................... 438/149, 164, 438/296, 581, 630, 649, 651, 655, 682, 683, 218, 221, 424, 430; 257/347, 377, 382, 383, 384, 374

(56) References Cited

U.S. PATENT DOCUMENTS

| | | | | |
|---|---|---|---|---|
| 4,522,845 A | * | 6/1985 | Powell et al. ................ 438/664 |
| 4,711,017 A | * | 12/1987 | Lammert | |
| 5,086,017 A | * | 2/1992 | Lu ............................... 438/586 |
| 5,138,573 A | * | 8/1992 | Jeuch ........................... 257/316 |
| 5,278,438 A | * | 1/1994 | Kim et al. .................... 257/316 |
| 5,830,775 A | * | 11/1998 | Maa et al. .................... 438/141 |
| 5,872,044 A | * | 2/1999 | Hemmenway et al. ....... 438/426 |
| 6,017,801 A | * | 1/2000 | Youn ........................... 438/296 |
| 6,133,105 A | * | 10/2000 | Chen et al. .................. 438/296 |
| 2003/0036233 A1 | * | 2/2003 | Chen ........................... 438/261 |

* cited by examiner

Primary Examiner—Carl Whitehead, Jr.
Assistant Examiner—Jennifer M Dolan
(74) Attorney, Agent, or Firm—Finnegan, Henderson, Farabow, Garrett & Dunner, L.L.P.

(57) ABSTRACT

A highly-integrated, high speed semiconductor device includes a device isolation film defining an active region at a SOI wafer having a stacked structure of a first silicon layer, a filled insulating film and a second silicon layer—the second silicon layer being the active region between the device isolation film with an intervening first silicide layer; the first silicide layer formed on a gate electrode on the active region and an impurity junction region; and a second silicide layer intervening at the interface of a device isolation film and a second silicon layer and connected to the first silicide layer. Thus, operating characteristics of the device are improved by minimizing the resistance of an impurity junction region and reducing the manufacturing cost.

7 Claims, 2 Drawing Sheets

SEMICONDUCTOR DEVICE AND METHOD OF FORMING THE SAME

FIELD OF THE INVENTION

The invention generally relates to a semiconductor device and method of forming the same, and more particularly to a device and method that improves operating characteristics by forming a transistor in upper silicon of a SOI (silicon-on-insulator) wafer, that is, in an active region of a second silicon layer, wherein a silicide layer is formed at an interface of the active region and a device isolation region.

DESCRIPTION OF THE PRIOR ART

As the length of a gate electrode of a semiconductor device is reduced to below 0.15 $\mu$m, the channel resistance of the device is reduced, which relatively increases the importance of the parasitic resistance during device operation. Due to this phenomenon, salicide technology is required to reduce contact resistance between a gate and a diffusion layer in a high speed logic device.

In addition, because increasing the integration level of a device requires increasing wiring using a diffusion layer, reduction in the resistance of the diffusion layer and the gate electrode is required. However, the diffusion layer becomes shallower due to a decrease in the width of the gate electrode. Thus, the thickness of salicide is reduced, which undesirably increases the resistance of the diffusion layer.

Accordingly it is desirable to lower the resistance of the diffusion layer while solving the problem of a shallow junction using a SOI wafer in highly integrated semiconductor devices.

One solution is to use cobalt salicide, which has no dependency on the line width. However, this may result in leakage current. Leakage current is generated by lateral growth of salicide during formation of thick salicide in a depletion region at the edge of the field oxide and by diffusion of high melting metal used as silicide during the process of forming thick salicide.

SUMMARY OF THE INVENTION

The present invention provides a semiconductor device and method of forming the same that allows high integration of the device by forming a suicide layer at the interface of a device isolation film, which defines an active region in a second silicon layer of a SOI wafer and a second silicon layer of the active region.

The present invention provides a semiconductor device comprising a SOI wafer having a stacked structure of a first silicon layer, a buried insulating film and a second silicon layer; a trench formed by removing a predetermined region of the second silicon layer; a first silicide layer formed at the side walls of the trench; a device isolation film defining an active region of the SOI wafer formed by filling the trench; a gate electrode having a gate insulation film formed on the active region of the SOI wafer; an insulation spacer formed at the side walls of the gate electrode; impurity junction regions formed at both sides of the gate electrode in the active region of the SOI wafer; and a second silicide layer formed on the gate electrode and the impurity regions, wherein the first and the second silicide layers are comprised of a metal selected from the group consisting of titanium, cobalt, nickel, and tungsten.

The present invention also provides a method of forming a semiconductor device comprising forming a pad insulating film on a SOI wafer having a stacked structure of a first silicon layer, a buried insulating film, and a second silicon layer; etching a predetermined region of the pad insulating film and the second silicon layer by a lithography process using a device isolation mask to form a trench exposing the buried insulating film; forming a first silicide layer at side walls of the trench; forming a device isolation film defining an active region by filling the trench; forming a transistor having a gate electrode, a insulation spacer and impurity junction regions on the second silicon layer in the active region; and forming a second silicide layer on the gate electrode and the impurity junction regions.

A first silicide layer is formed by forming a high melting point metal layer on the entire surface having a thickness in a range of 100–300 Å using a CVD method, performing an annealing process, and removing an unreacted portion of the high melting point metal layer, wherein the high melting point metal layer comprises a metal selected from the group consisting of titanium, cobalt, nickel, and tungsten. The annealing process is performed at a temperature in a range of 900–1000° C. for 10–60 seconds, and the unreacted portion of the high melting point metal layer is removed by performing a first wet etch process using a $HNO_3$ solution and a second wet etch process using a HF solution diluted in the $HNO_3$ solution. A second silicide layer is formed by forming a high melting point metal layer having a predetermined thickness on the entire surface, performing a first annealing process at a temperature in a range of 650–750° C. for 10–30 seconds, removing an unreacted portion of the high melting point metal layer, and performing a second annealing process at a temperature in a range of 800–1000° C. for 10–30 seconds, wherein the high melting point metal layer comprises a metal selected from the group consisting of titanium, cobalt, nickel, and tungsten.

In accordance with the present invention, a transistor having an improved operating characteristics sufficient for high integration is provided by etching a second silicon layer of a SOI wafer to form a trench exposing a buried oxide film, forming a device isolation film filling the trench, wherein a silicide layer is formed at the side walls of the trench before filling the trench, thereby forming a silicide layer at the interface between a device isolation film in a device isolation region and a second silicon layer in an active region, and forming the transistor in the second silicon layer by subsequently using a salicide process.

BRIEF DESCRIPTION OF THE DRAWINGS

The aforementioned aspects and other features of the present invention will be explained in the following description, taken in conjunction with the accompanying drawings, wherein.

DETAILED DESCRIPTION

Figure 1A:
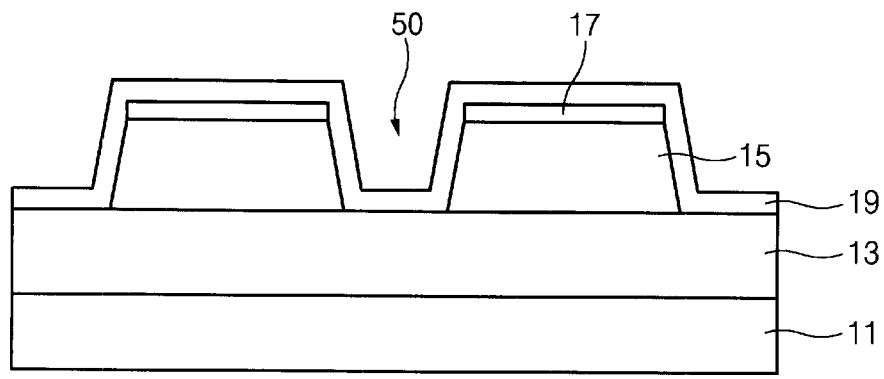
FIGS. 1a–1e are cross-sectional views illustrating a semiconductor device and method of forming the same according to an embodiment of the present invention.

The present invention will be described in detail by way of an embodiment with reference to accompanying drawings, in which like reference numerals are used to identify the same or similar parts.

FIGS. 1a–1e are cross-sectional views illustrating a semiconductor device and a method of forming the same according to an embodiment of the present invention.

The device shown in FIG. 1a may be formed as follows. A SOI wafer comprising a first silicon layer 11, a buried oxide film 13, and a second silicon layer 15 is formed. A pad nitride film 17 is then formed on the SOI wafer. Next, pad nitride film 17 and second silicon layer 15 are etched by a photolithography process using a device isolation mask (not shown) to form a trench 50 exposing buried oxide film 13. Thereafter, a high melting point metal layer 19 with predetermined thickness is formed on the entire surface. High melting point metal layer 19 may be formed of tungsten having a thickness in a range of 100–300 Å using a CVD method. Nickel, cobalt, or titanium may be used instead of tungsten to form the high melting point metal layer 19.

Figure 1B:
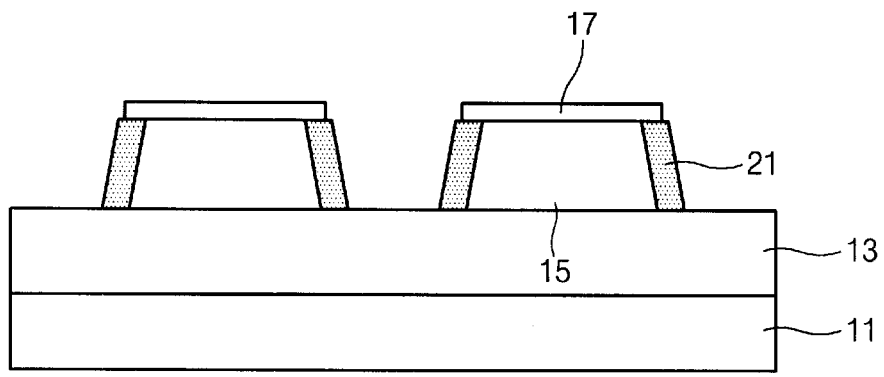

Referring now to FIG. 1b, the SOI wafer is annealed to silicidize high melting point metal layer 19 of FIG. 1a contacting the second silicon layer 15, thereby forming a first silicide layer 21 at the sidewall of trench 50. At this time, the annealing process is preferably performed at a temperature in a range of 900–1000° C. for 10–60 seconds.

Next, the high melting point metal layer 19 of FIG. 1a formed on the buried oxide film 13 and pad nitride film 17 is removed by a wet etch method. At this time, the wet etch method includes a first wet etch process using $HNO_3$ solution and a second wet etch process using HF solution diluted in the $HNO_3$ solution.

Figure 1C:
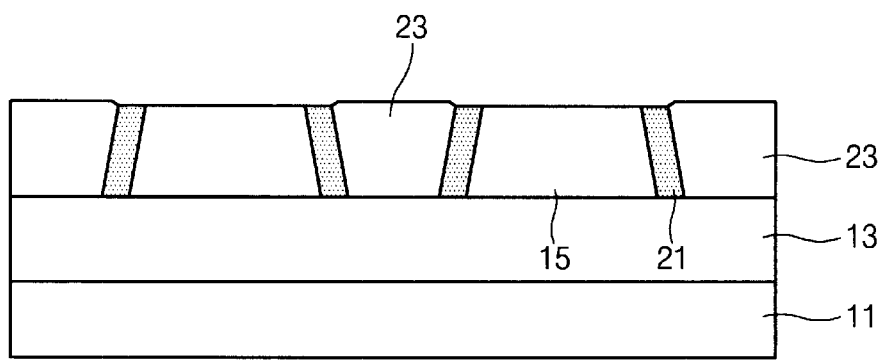

Referring now to FIG. 1c, an insulating film for device isolation film filling trench 50 is formed on the entire surface and then planarized to form a device isolation film 23 filling trench 50 of FIG. 1a. A first silicide layer 21 is then provided at the interface of device isolation film 23 and second silicon layer 15.

Figure 1D:
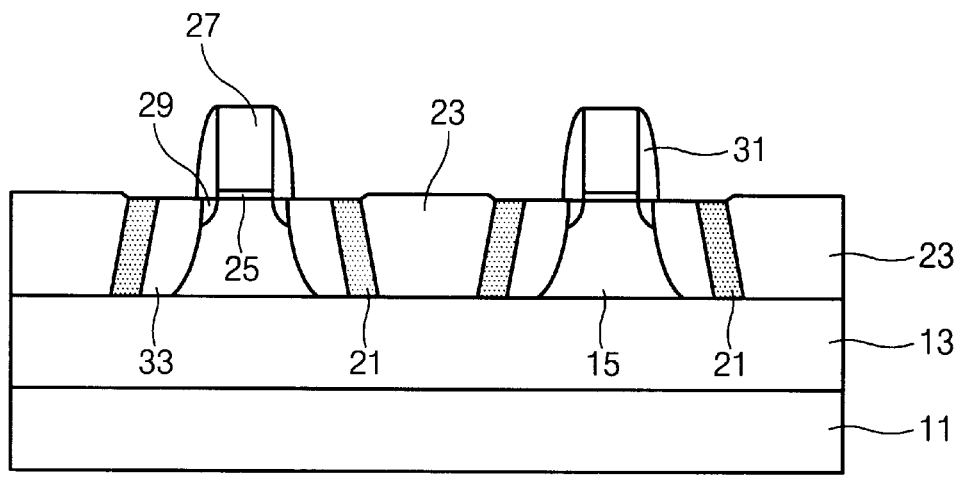

Referring now to FIG. 1d, a thermal oxide film (not shown) and a conductive layer (not shown) for a gate electrode are deposited on the entire surface including second silicon layer 15. They are then patterned by a lithography etch process using a gate electrode mask (not shown) to form a gate electrode 27 having a gate oxide film 25 at the interface of second silicon layer 15. Also, low concentration impurities are injected into second silicon layer 15 using gate electrode 27 as a mask to form a low concentration impurity junction region 29.

Next, an insulating film spacer 31 is formed at the sidewall of gate electrode 27. Then, high concentration impurities are injected into the second silicon layer 15 using the insulating film spacer 31 and the gate electrode 27 as a mask to form a high concentration impurity junction region 33.

Figure 1E:
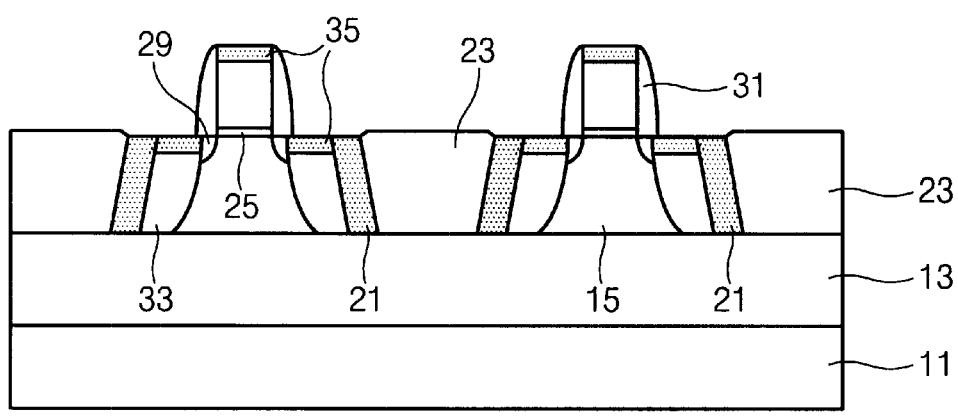

With reference to FIG. 1e, a second silicide layer 35 is formed on impurity high concentration junction region 33 and gate electrode 27 using a salicide process, thereby reducing the resistance of the impurity junction region 33 and improving the operating characteristic of the device. In one embodiment, the salicide process comprises forming a high melting point metal with a predetermined thickness on the entire surface where gate electrode 27 and impurity high concentration junction region 33 are formed, performing a first annealing process at a temperature in a range of 650–750° C. for 10–30 seconds, removing non-reacted high melting point metal, and performing a second annealing process at a temperature in a range of 800–1000° C. for 10–30 seconds to form a silicide layer.

As described above, a semiconductor device and method of forming the same according to the present invention provides a transistor using a SOI wafer, wherein a silicide layer is formed on and at the sidewall of the impurity high concentration junction region, which minimizes the resistance of an impurity junction region and improves operating characteristics of the semiconductor device. Further, the present invention provides a high-speed semiconductor device without using a high cost lithography process, thus reducing the manufacturing cost of the semiconductor device.

The present invention has been described with reference to particular embodiments in connection with particular applications. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a semiconductor device, comprising the steps of:
    forming a pad insulating film on a SOI wafer having a stacked structure of a first silicon layer, a buried insulating film and a second silicon layer;
    etching a predetermined region of the pad insulating film and the second silicon layer by a lithography process using a device isolation mask to form a trench exposing the buried insulating film;
    forming a first silicide layer at side walls of the trench;
    forming a device isolation film defining an active region by filling the trench;
    forming a transistor having a gate electrode, an insulation spacer, and impurity junction regions on the second silicon layer in the active region,
    wherein the transistor, insulation spacer, and impurity junction regions are formed after forming the device isolation film; and
    forming a second silicide layer on the gate electrode and the impurity junction regions.

2. The method according to claim 1, wherein the step of forming the first silicide layer comprises the steps of forming a high melting point metal layer on the entire surface having a thickness in a range of 100–300 Å using a CVD method, performing an annealing process, and removing an unreacted portion of the high melting point metal layer.

3. The method according to claim 2, wherein the high melting point metal layer comprises a metal selected from the group consisting of titanium, cobalt, nickel, and tungsten.

4. The method according to claim 2, wherein the annealing process is performed at the temperature in a range of 900–1000° C. for 10–60 seconds.

5. The method according to claim 2, wherein the step of removing the unreacted portion of the high melting point metal layer comprises performing a first wet etch process using a $HNO_3$ solution and a second wet etch process using a HF solution diluted in the $HNO_3$ solution.

6. The method according to claim 1, wherein the step of forming the second suicide layer comprises the steps of forming a high melting point metal layer of a predetermined thickness on the entire surface, performing a first annealing process at a temperature in a range of 650–750° C. for 10–30 seconds, removing an unreacted portion of high melting point metal layer, and performing a second annealing process at a temperature in a range of 800–1000° C. for 10–30 seconds.

7. The method according to claim 6, wherein the high melting point metal layer comprises a metal selected from the group consisting of titanium, cobalt, nickel, and tungsten.

* * * * *